(12) United States Patent
Huang

(10) Patent No.: US 8,471,387 B2
(45) Date of Patent: Jun. 25, 2013

(54) EXTENDABLE NETWORK STRUCTURE

(75) Inventor: Kevin T. Y. Huang, Taipei (TW)

(73) Assignee: Monolithe Semiconductor Inc., Taipei (TW)

( * ) Notice: Subject to any disclaimer, the term of this patent is extended or adjusted under 35 U.S.C. 154(b) by 57 days.

(21) Appl. No.: 13/105,239

(22) Filed: May 11, 2011

(65) Prior Publication Data

US 2011/0278729 A1    Nov. 17, 2011

Related U.S. Application Data

(60) Provisional application No. 61/395,342, filed on May 12, 2010.

(51) Int. Cl.
*H01L 29/40* (2006.01)

(52) U.S. Cl.
USPC .......... 257/773; 257/786; 257/E23.168; 257/E21.575; 257/E23.01; 438/129

(58) Field of Classification Search
USPC .......................................................... 257/773
See application file for complete search history.

(56) References Cited

U.S. PATENT DOCUMENTS

| | | | |
|---|---|---|---|
| 6,344,616 B1 * | 2/2002 | Yokokawa | 174/117 F |
| 6,370,964 B1 * | 4/2002 | Chang et al. | 73/862.046 |
| 6,743,982 B2 * | 6/2004 | Biegelsen et al. | 174/69 |
| 7,265,298 B2 * | 9/2007 | Maghribi et al. | 174/254 |
| 7,834,424 B2 | 11/2010 | Peumans et al. | |
| 8,207,473 B2 * | 6/2012 | Axisa et al. | 219/121.72 |
| 8,258,011 B2 * | 9/2012 | Brun et al. | 438/113 |
| 2002/0094701 A1 * | 7/2002 | Biegelsen et al. | 439/32 |
| 2004/0192082 A1 * | 9/2004 | Wagner et al. | 439/67 |
| 2008/0064125 A1 * | 3/2008 | Peumans et al. | 438/6 |
| 2009/0067144 A1 * | 3/2009 | Lanzara et al. | 361/776 |
| 2009/0283891 A1 * | 11/2009 | Dekker et al. | 257/690 |
| 2010/0224950 A1 | 9/2010 | Dinyari et al. | |
| 2011/0042832 A1 * | 2/2011 | Peumans et al. | 257/786 |

* cited by examiner

*Primary Examiner* — N Drew Richards
*Assistant Examiner* — Ankush Singal
(74) *Attorney, Agent, or Firm* — McClure, Qualey & Rodack, LLP

(57) ABSTRACT

Disclosed herein is an extendable network structure, which includes a first device portion, a second device portion and at least three connectors. The three connectors are connected to the first device portion. The second device portion is electrically connected to the first device portion through one of the three connectors. The first and second device portions respectively have a first and a second center. Each of the connectors may be extendable from an initial state to an extended state, such that a first distance between the first and second centers in the extended state is at least 1.1 fold of a second distance between the first and second centers in the initial state.

45 Claims, 16 Drawing Sheets

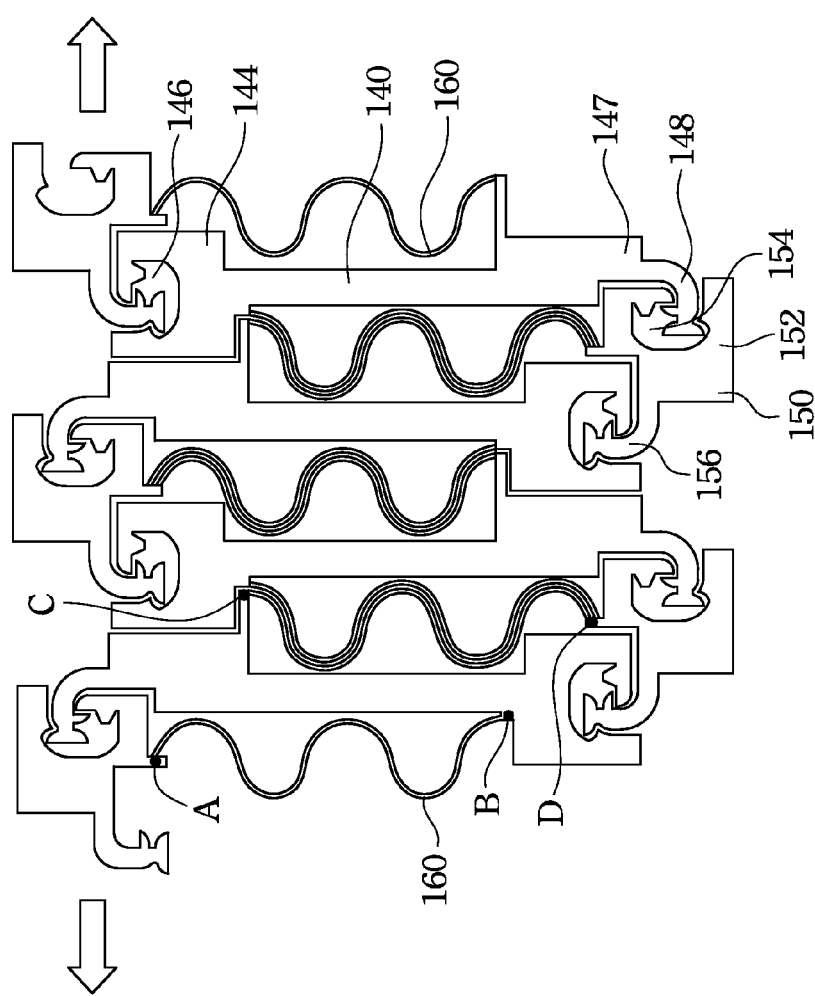
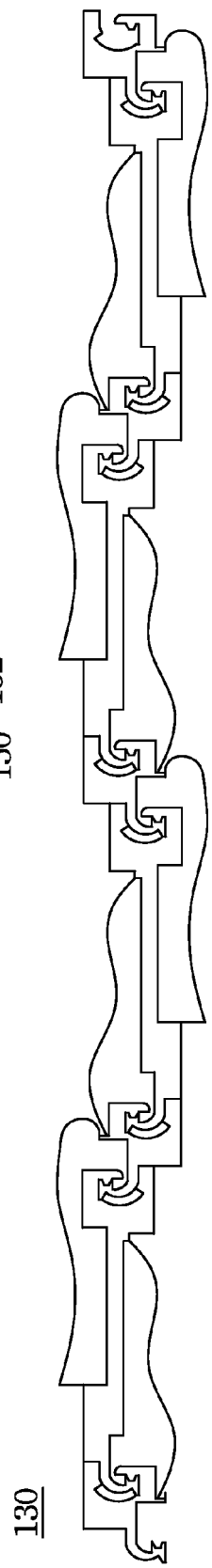
Fig. 5A
Fig. 5B

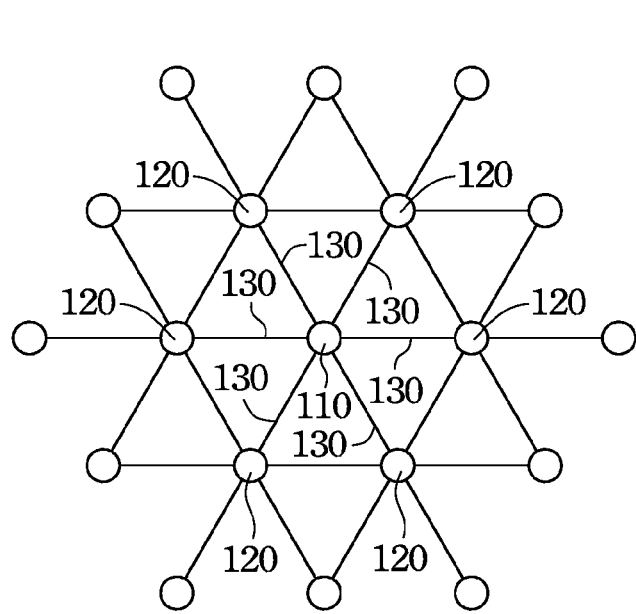
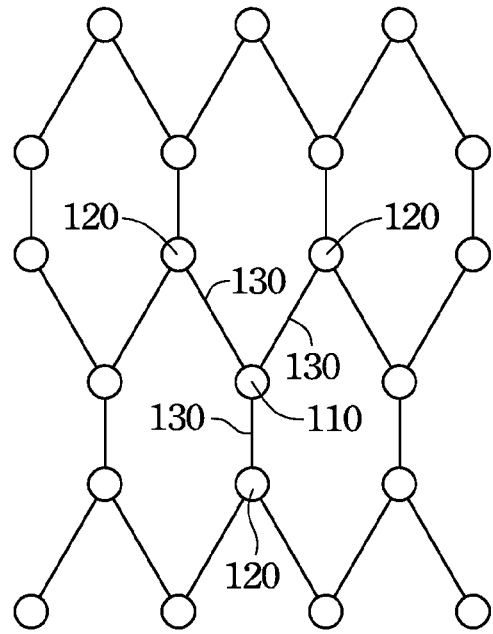
Fig. 8A Fig. 8B
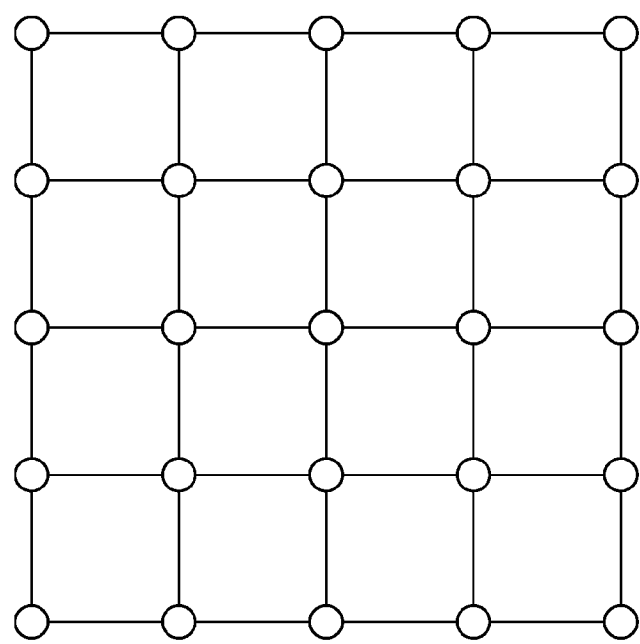
Fig. 8C

EXTENDABLE NETWORK STRUCTURE

RELATED APPLICATIONS

This application claims priority to U.S. Provisional Application Ser. No. 61/395,342, filed May 12, 2010, which is herein incorporated by reference.

BACKGROUND

1. Field of Invention

The present invention relates to an extendable network structure. More particularly, the present invention relates to an extendable network structure with semiconductor devices.

2. Description of Related Art

Technologies of fabricating semiconductor device have been developed for several decades, and manage to produce integrated circuits used in electronic devices. Such integrated circuits are individually connected through pick-and-place and wire-bonding processes and mounted on a substrate to provide desired functions of the device.

Another approach to fabricate electronic devices is the micro-electromechanical system (MEMS), which combines typical semiconductor processes and mechanical fabrications to accomplish certain functions of gadgets. In this technology, the MEMS gadget is individually equipped on a substrate or an article as well.

Many applications are limited in their scalability as related to the above inflexibility or otherwise. This has made certain circuit applications relatively difficult to implement with a variety of applications, such as those benefiting from large, complex networks and, often, high-density networks. Therefore, there exists in this art a need of a novel and cost-effective structure that would provide a flexible and large-area function.

SUMMARY

An extendable network structure is provided. According to one embodiment of the present disclosure, the extendable network structure comprises a first device portion, a second device portion and at least three connectors. Each of the first and second device portions comprises a semiconductor element. The three connectors are connected to the first device portion. Moreover, the second device portion is electrically connected to the first device portion through one of the three connectors. The first and second device portions respectively have a first and a second center. Each of the connectors may be extendable from an initial state to an extended state, such that a first distance between the first and second centers in the extended state is at least 1.1 fold of a second distance between the first and second centers in the initial state.

According to one example of the present disclosure, the first and second centers are geometric centers, mass centers or centers of symmetry.

According to one example of the present disclosure, each of the device portions and each of the connectors are part of a common material layer formed on a substrate.

According to one example of the present disclosure, the three connectors are substantially arranged on an identical level. In this example, an included angle formed between two adjacent connectors, in the extended state, is about 120 degrees.

According to one example of the present disclosure, the first and second device portions are of identical shapes.

According to another embodiment of the present disclosure, the extendable network structure comprises a central portion, at least three surrounding portions and at least three connectors. Each of the central portion and the surrounding portions comprises a semiconductor device. The three surrounding portions are arranged around the central portion. Each of the surrounding portions is connected to the central portion through one of the connectors. The central portion has a first center while each of the surrounding portions has a second center. Each of the connectors may be extendable from an initial state to an extended state, such that a first distance between the first center and one of the second centers in the extended state is at least 1.1 fold of a second distance between the first center and the second center in the initial state.

According to one example of the present disclosure, the extendable network structure may further comprise a fourth surrounding portion and a fourth connector. The fourth connector is connected with the fourth surrounding portion and the central portion. In this example, all the connectors are substantially arranged on an identical level, and an included angle formed between two adjacent connectors in the extended state to be about 90 degrees.

According to one example of the present disclosure, each of the connectors wind around the central portion while each of the connectors is in the initial state.

According to one example of the present disclosure, the extendable network structure may further comprise a plurality of bridges, and each of the bridges interconnects between two of the connectors. In some example, the bridges may be arranged to interconnect between the central portion and one of the connectors.

According to one example of the present disclosure, at least one of the three connectors has a length that is different from the other two connectors.

According to one example of the present disclosure, all the three connectors are equi-length.

According to one example of the present disclosure, each of the connectors has a height that is different from the central portion.

According to one example of the present disclosure, each of the connectors comprises a plurality of arms and a plurality of 90 degree-rotation-restriction joints. Any two adjacent arms are joined by one of the 90 degree-rotation-restriction joints, and thus allowing each of the connectors to be extendable from a folded state to a straight state. In this example, the connector may further comprises a plurality of metal wires, and each of the metal wires is connected with one of the arms and one of the 90-degree-rotation-restriction joints that adjoins the arm. Furthermore, each of the 90 degree-rotation-restriction joints comprises a body and a first hook. The body has a first cavity for joining to one of the arms. The first hook extends from the body and is operable to join to another arm. In addition, each of the arms comprises an end having a second cavity for housing the first hook; and an opposite end having a second hook that extends into one of the first cavity.

According to still another embodiment of the present disclosure, the extendable network structure comprises a central portion, at least six connectors and at least six surrounding portions. The six connectors are connected to the central portion, and each of the connectors may be extendable from an initial state to an extended state. The six surrounding portions spaced apart from the central portion, and are connected to the central portion through each respective connector. While the connectors are in the extended state, there exists between the central portion and the surrounding portions a minimum distance that is at least 1.1 fold of a minimum distance between the central portion and the surrounding portions in the initial state.

According to one example of the present disclosure, the six surrounding portions are substantially arranged on an identical level, and an included angle formed between two adjacent connectors, in the extended state, is about 60 degrees.

According to still another embodiment of the present disclosure, the extendable network structure comprises a device network, a supporting beam surrounding the device network, and a plurality of third connectors. The device network comprises a plurality of device portions and a plurality of first connectors. Each of the device portions has a semiconductor element, and any two adjacent device portions are connected by one of the first connectors so as to form the device network. The supporting beam comprises a plurality of second connectors and a plurality of nodes. Any two adjacent nodes are connected by one of the second connectors, and thus forming a closed-loop surrounding the network. The third connectors are arranged between the device network and the supporting beam. Each of the third connectors is connected with one of the nodes of the supporting beam and one of the device portions that are located at a periphery of the network. Furthermore, each of the first, second and third connectors may be extendable from an initial state to an extended state, such that a spacing interval existed between two adjacent device portions in the extended state is at least 1.1 fold of a spacing interval existed between the two device portions in the initial state.

According to one example of the present disclosure, each of the third connectors provides a tension to the periphery of the device network while each of the first, second and third connectors is in the extended state.

According to one example of the present disclosure, at least one of the second connectors has a length that is different from another second connector.

According to one example of the present disclosure, each of the second connectors has a width that is different from each of the first connectors.

According to one example of the present disclosure, at least one of the third connectors has a length that is different from another third connector.

According to one example of the present disclosure, each of the third connectors has a width that is different from each of the first connectors.

According to still another embodiment of the present disclosure, the extendable network structure comprises a device network, a plurality of pulling pads and a plurality of pulling wires. The device network comprises a plurality of connectors and a plurality of device portions. Each of the connectors is capable of being deployed. Each of the device portions has a semiconductor element. Any two adjacent device portions are connected by one of the connectors to form the device network, wherein the device network is extendable from an initial state to an extended state by deploying each of the connectors, such that a minimum distance between two adjacent device portions in the extended state is at least 1.1 fold of a minimum distance between the two device portions in the initial state. The pulling pads are configured to deploy the device network, and are disposed at a periphery of the device network. Each of the pulling wires interconnects between one of the pulling pads and the device network.

According to one example of the present disclosure, each of the pulling pads is connected to one device portion only.

According to one example of the present disclosure, each of pulling pads has a maximum dimension different from that of each of the device portions.

It is to be understood that both the foregoing general description and the following detailed description are by examples, and are intended to provide further explanation of the invention as claimed.

BRIEF DESCRIPTION OF THE DRAWINGS

The invention can be more fully understood by reading the following detailed description of the embodiments, with reference made to the accompanying drawings as follows:

FIG. 5A is a top view schematically illustrating a connector in an initial state according to one embodiment of the present disclosure;

FIG. 5B is a top view illustrating an extended state of the connector depicted in FIG. 5A;

FIGS. 8A-8C are top views respectively schematically illustrating an extendable network structure in the extended state according to embodiments of the present disclosure;

DETAILED DESCRIPTION

Figure 1A:
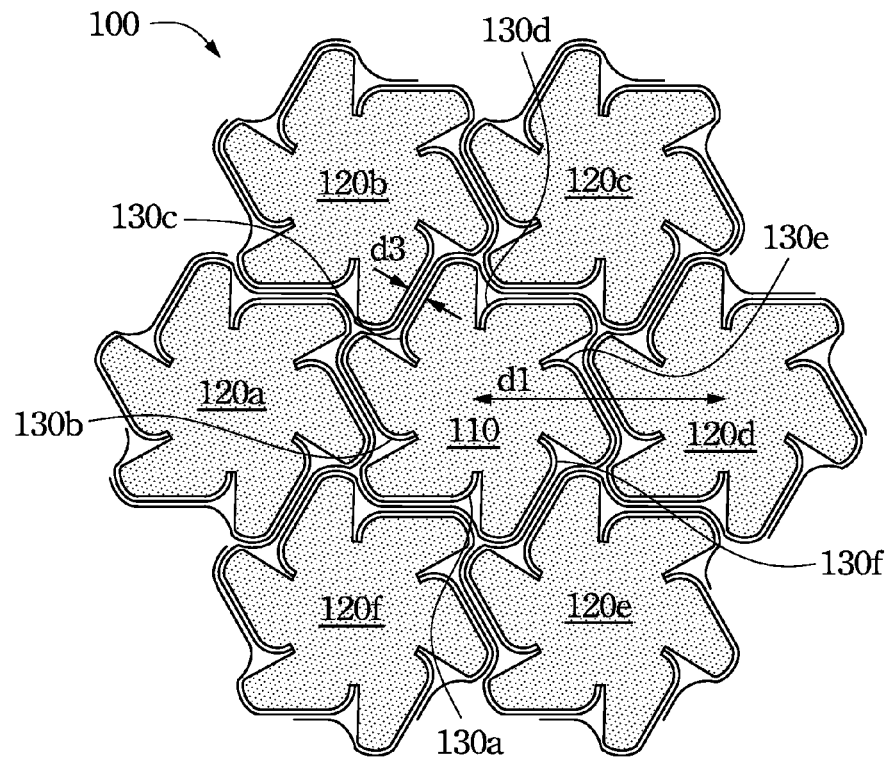
FIG. 1A is a top view schematically illustrating an extendable network structure in an initial state according to one embodiment of the present disclosure.

Reference will now be made in detail to the present embodiments of the invention, examples of which are illustrated in the accompanying drawings. Wherever possible, the same reference numbers are used in the drawings and the description to refer to the same or like parts.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawings.

Disclosed herein is an extendable network structure, which may be extended from an initial state to an extended state. The extendable network structure comprises a plurality of device portions and a plurality of connectors. Any two adjacent device portions are connected by one of the connectors, and thus forming the extendable network structure. The connectors may be extended while an external force or tension is applied thereto. Therefore, a distance between two adjacent device portions may be increased while the connector is extended. As a result, the network structure may be extended from an initial state to an extended state.

Hereinafter, several example embodiments are described in detail with reference to figures.

Figure 1B:
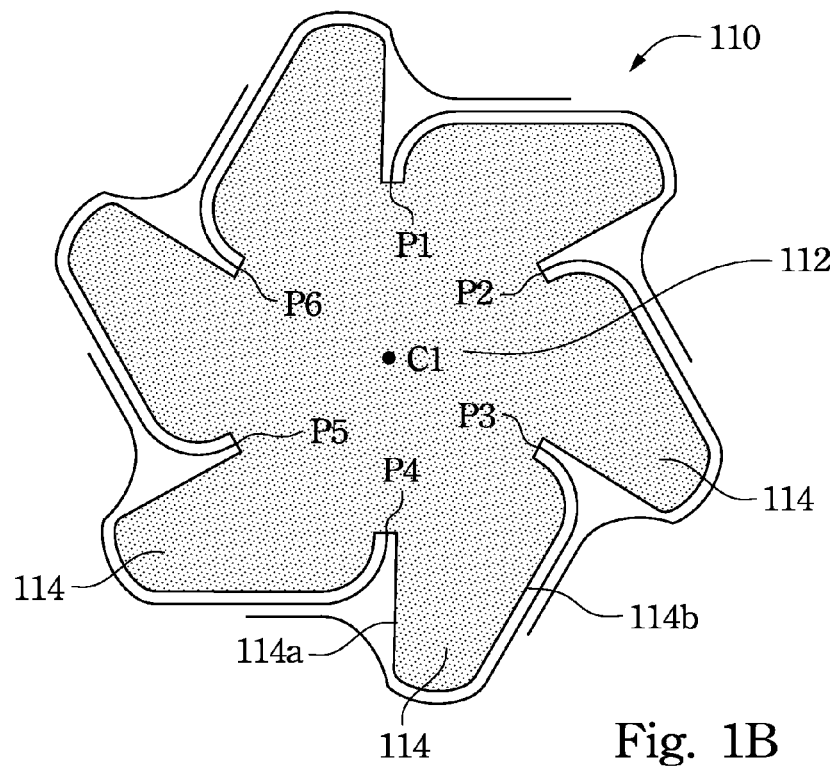
FIG. 1B is an enlarged drawing of the central portion in FIG. 1A.

FIG. 1A is a top view schematically illustrating an extendable network structure 100 in an initial state according to one embodiment of the present disclosure. The extendable network structure 100 includes a central portion 110, six surrounding portions 120a-120f, and six connectors 130a-130f. FIG. 1B depicts an enlarged drawing of the central portion 110.

The six surrounding portions 120a-120f are disposed around the central portion 110, and spaced apart from the central portion 110. Each of the central portion 110 and the surrounding portions 120a-120f includes a semiconductor element such as a transistor, light emitting diode, logic circuit, or sensing device, for example. The shape of the surrounding portion may be the same as or different from the central portion 110. In this embodiment, each of the surrounding portions 120a-120f has a shape that is the same as the central portion 110. In one example, the surrounding portions 120a-120f and the central portion 110 are arranged on an identical level.

Each of surrounding portions 120a-120f is connected or coupled to the central portion 110 through one of the six connectors 130a-130f. Specifically, the connectors 130a-130f are respectively connected to the surrounding portion 120a-120f. Each of the connectors 130a-130f may include a conductive material so that each of the surrounding portions 120a-120f may be electrically connected to the central portion 110. In particular, one or more metal layer(s) may be formed in each of the connectors 130a-130f, and thus electric signals or power may be transmitted between the central portion 110 and the surrounding portions. In the case where multiple metal layers are employed, one or more insulator layers may be disposed between these metal layers. In examples, each of the connectors 130a-130f has a width or height of nanoscale or microscale.

Figure 1C:
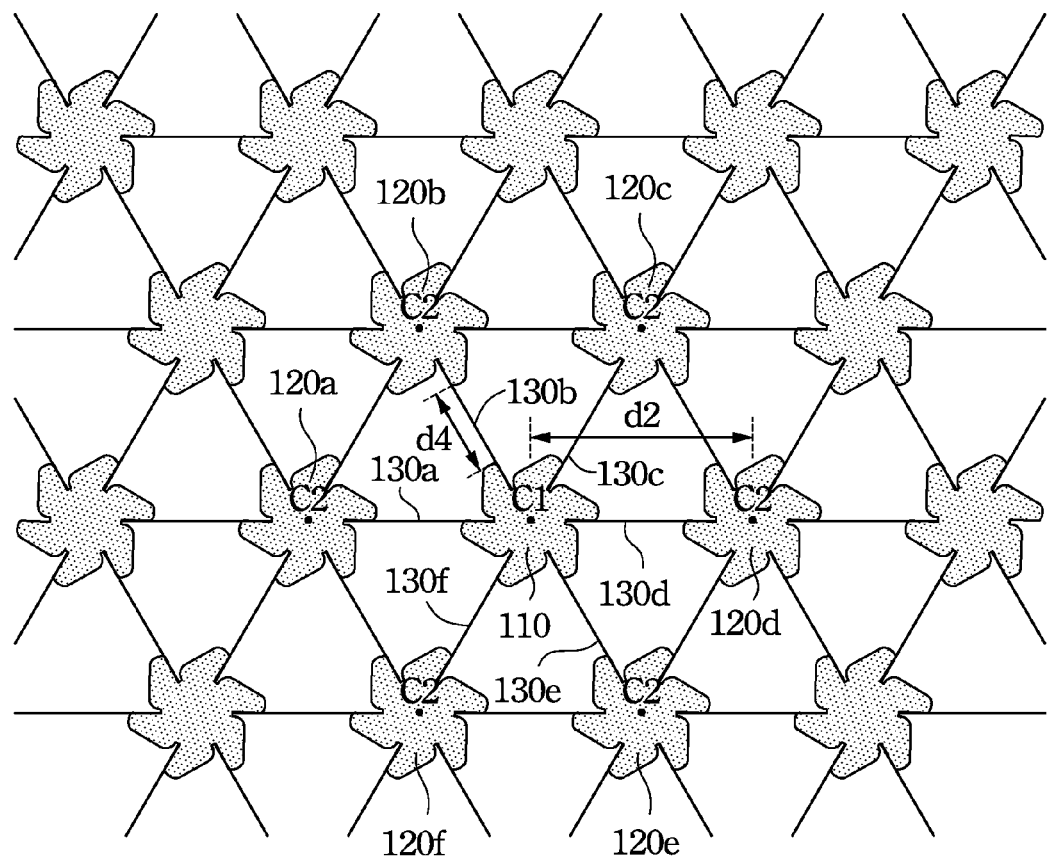
FIG. 1C is a top view schematically illustrating an extendable network structure in an extended state.

In the initial state, as depicted in FIG. 1A, the connectors 130a-130f wind and/or twist in the space existed between the central portion 110 and the surrounding portions 120a-120f. While an external force is applied to the network structure 100, the network structure 100 may be deployed or extended, and then the spacing interval, between the central portion and surrounding portions 120a-120f, may be enlarged. Accordingly, the network structure 100 may be transformed into an extended state, as depicted in FIG. 1C. Each of the connectors 130a-130f is stretched as a substantially straight line so as to increase the distance between two device portions (i.e. the central portion and the surrounding portion). The distance d2, between the center C1 of the central portion and the center C2 of the surrounding portion in the extended state, may be increased at least 1.1 fold of the distance d1, between the center C1 and the center C2 in the initial state. In examples, the distance d2 is at least 2 folds, 5 folds, or 10 folds of the distance d1. The center described above may be a geometric center, a mass center or a center of symmetry, for example. According to another aspect of the present disclosure, a minimum distance d4 existed between the central portion 110 and the surrounding portions 120a-120f in the extended state is at least 1.1 fold of a minimum distance d3 existed between the central portion 110 and the surrounding portions 120a-120f in the initial state. In examples, the distance d4 may be 2 folds, 5 folds, or 10 folds of the distance d3.

In this embodiment, each of the central portion 110 and the surrounding portions 120a-120f includes a body 112 and six petal portions 114 extended from the body 112, as depicted in FIG. 1B. At least one of the petal portions 114 has a straight edge 114a and a curved edge 114b. Specifically, each of the petal portions 114 has a similar contour, and is composed of the straight edge 114a and the curved edge 114b. The connectors 130a-130f are connected to the joint points P1-P6 of the body 112. The distances between the center C1 and the joint points P1-P6 are equal, and all the six connectors are equi-length in this embodiment.

In one example, each of the device portions and each of the connectors are part of a common material layer formed on a substrate such as a silicon wafer. In particular, the device portions and the connectors may comprise at least one of a conductive layer, silicon oxide layer and silicon nitride layer.

Figure 2A:
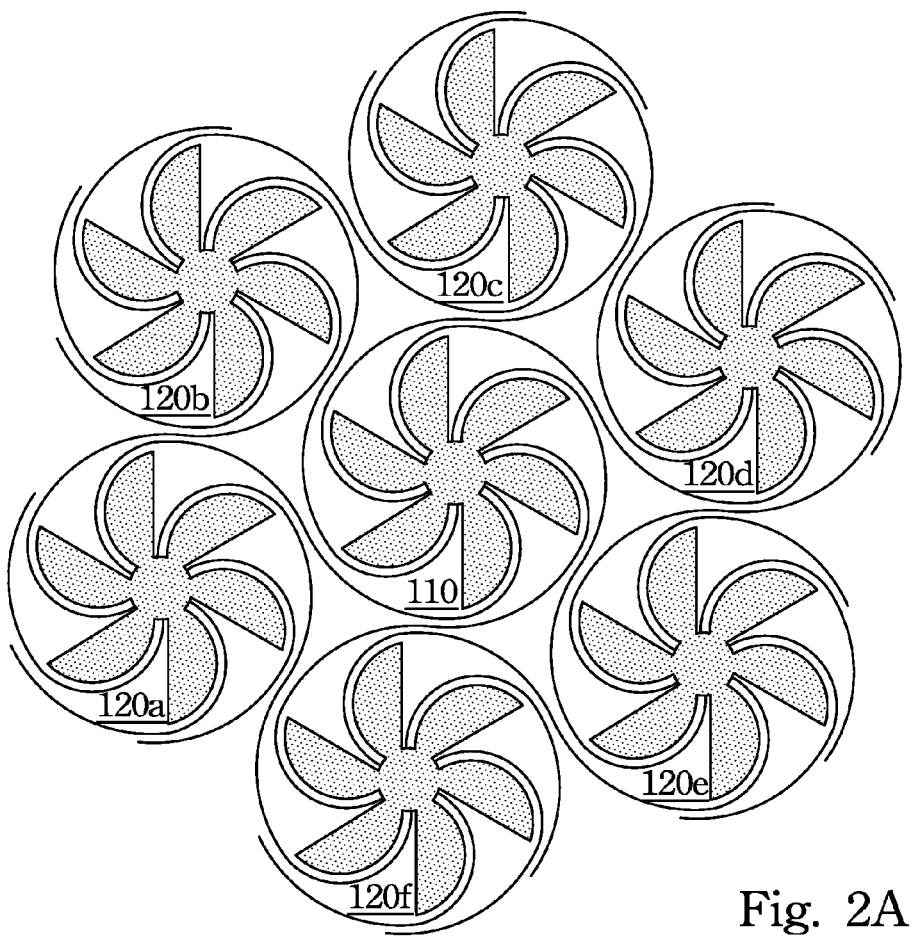
FIG. 2A is a top view schematically illustrating an extendable network structure in an initial state according to another embodiment of the present disclosure.
Figure 2B:
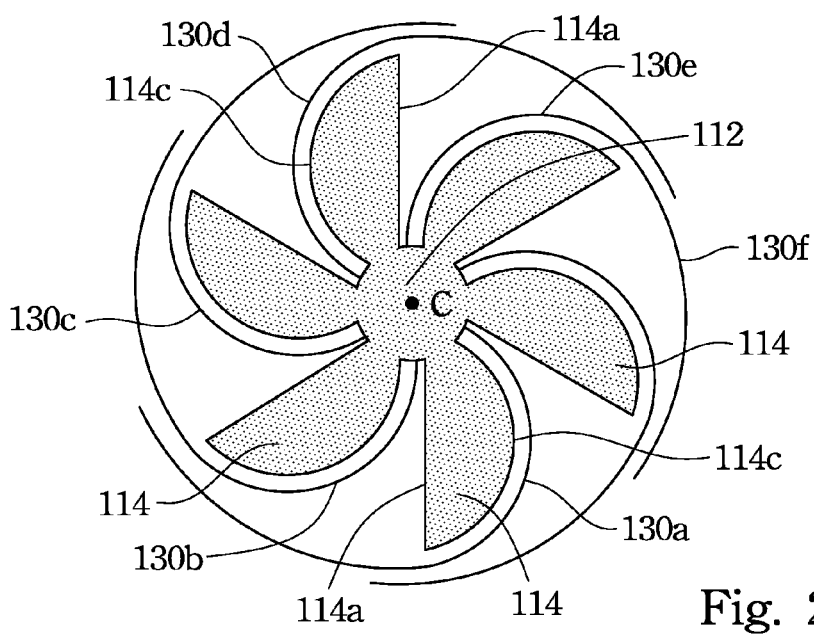
FIG. 2B depicts an enlarged drawing of the central portion in FIG. 2A.

FIG. 2A is a top view schematically illustrating an extendable network structure 100 in an initial state according to another embodiment of the present disclosure. The extendable network structure 100 includes a central portion 110, six surrounding portions 120a-120f, and six connectors 130a-130f. FIG. 2B depicts an enlarged drawing of the central portion 110. The network structure 100 depicted in FIG. 2A is configured in a way similar to FIG. 1A.

In this embodiment, each of the surrounding portions 120a-120f has a shape that is the same as the central portion 110. Further, each of these device portions includes a body 112 and six petal portions 114. The body 112 is substantially circular in shape, and each of the petal portions 114 has a straight edge 114a and an arc edge 114c. The petal portion 114 has a larger area than the body 112. However, in other examples, the area of the petal portion 114 may be smaller that of the body 112. One or more semiconductor element may be disposed on the petal portions 114 and/or the body 112. The connectors 130a-130f extend from the body 112 to the surrounding portions 120a-120f respectively, along the arc edges 114c and through the space between the central portion 114 and the surrounding portions 120a-120f. Each of the connectors 130a-130f may have a structure similar to those described above.

Figure 3A:
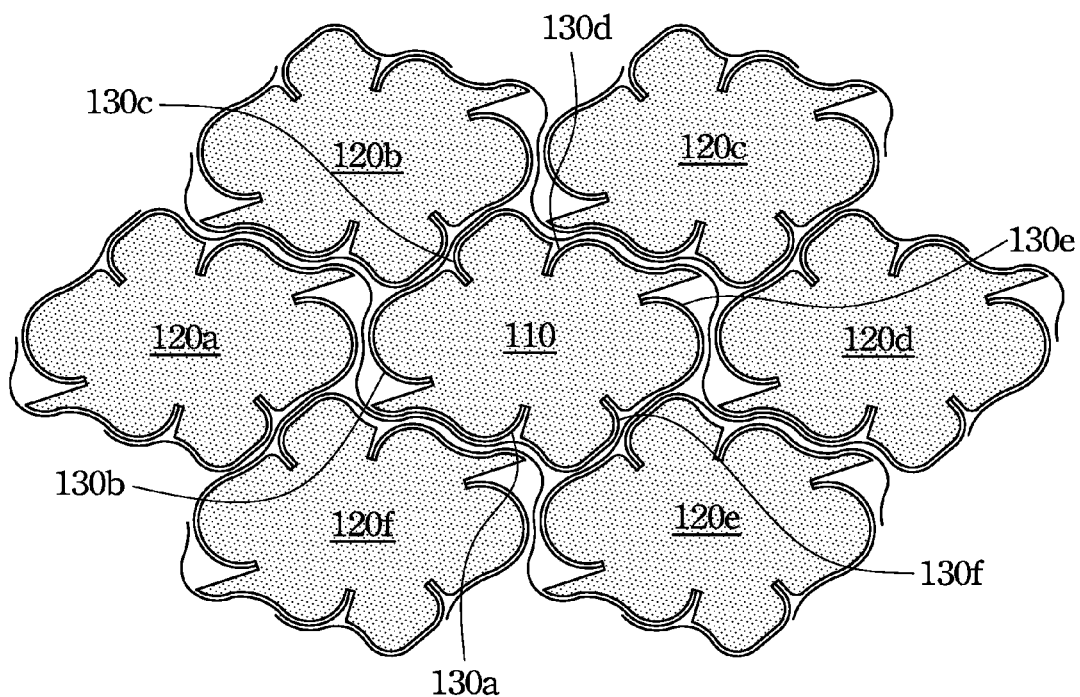
FIG. 3A is a top view schematically illustrating an extendable network structure in an initial state according to another embodiment of the present disclosure.
Figure 3B:
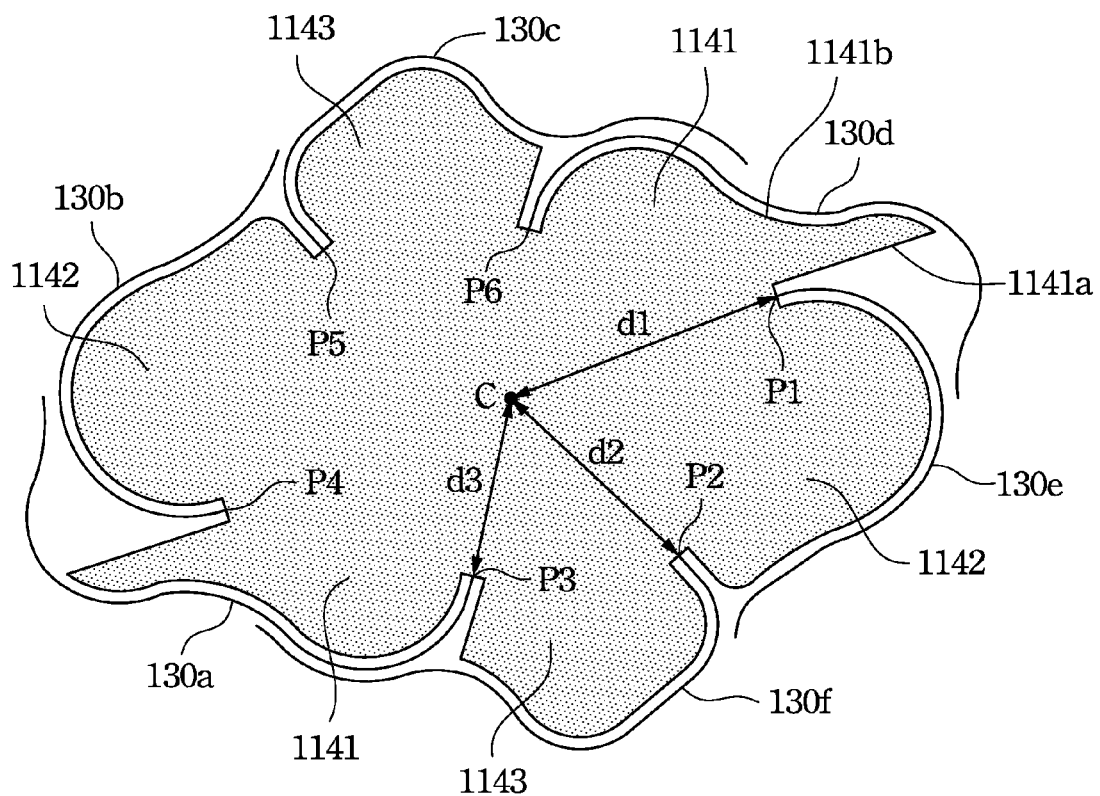
FIG. 3B is an enlarged drawing of the central portion in FIG. 3A.
Figure 3C:
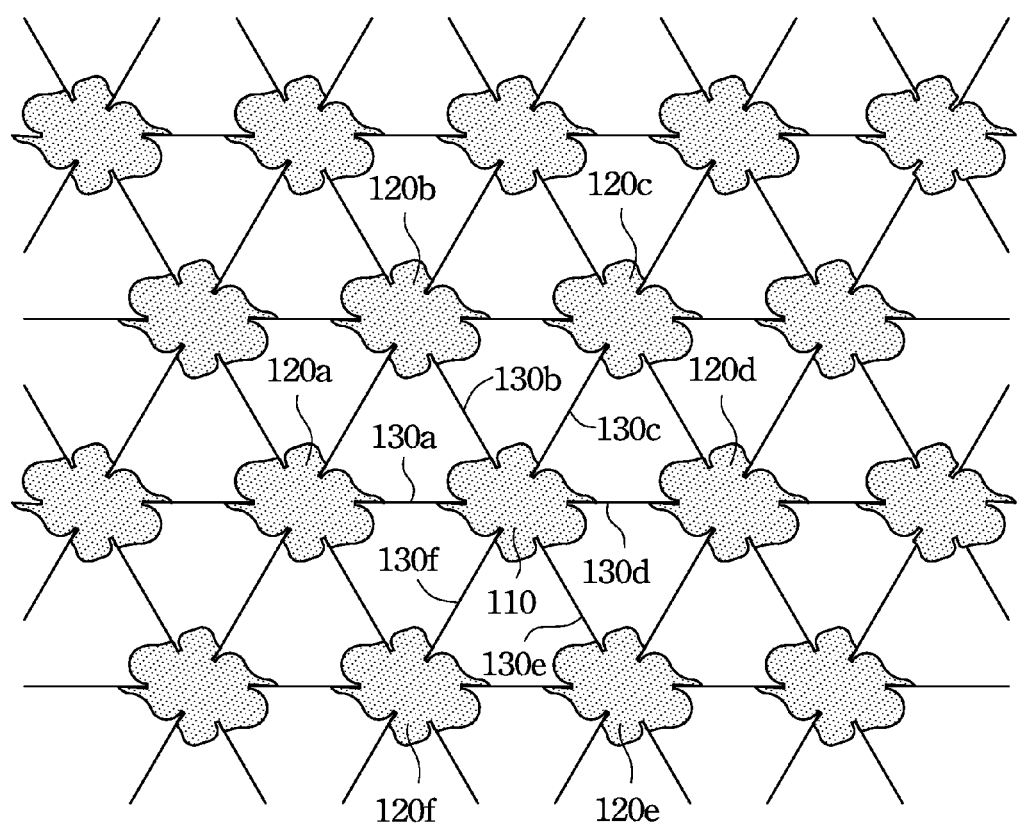
FIG. 3C is a top view schematically illustrating an extendable network structure in an extended state.

FIG. 3A is a top view schematically illustrating an extendable network structure 100 in an initial state according to another embodiment of the present disclosure. The extendable network structure 100 includes a central portion 110, six surrounding portions 120a-120f, and six connectors 130a-130f. FIG. 3B depicts an enlarged drawing of the central portion 110. FIG. 3C depicts the network structure 100 in an extended state.

In this embodiment, each of the surrounding portions 120a-120f has a shape that is the same as the central portion 110. Each of these device portions includes a body 112, three pairs of petal portions 1141, 1142 1143, as illustrated in FIG. 3B. Each of the pairs of petal portions is symmetric with respect to a geometric center C. In one example, at least one pair of petal portion, for example petal portion 1141 has a straight edge 1141a and a curved edge 1141b. However, in other examples, all pairs of the petal portion 1141, 1142 1143 may have shapes consisting of curved edges. It is to be noted that the device portion (i.e. the central portion or surrounding portions) may have an asymmetric shape although the device portion depicted in FIG. 3B is symmetric.

The central portion 110 has six joint points P1-P6 for respectively connecting to the connectors 130a-130f, as depicted in FIG. 3B. The distance d1 between the center C and the first joint point P1 is greater than the distance d2 between the center C and the second joint point P2. Also, the distance d2 is greater than the distance d3 between the center C and the third joint point P3. The first, second, and third joint points P1, P2, P3 are respectively connected to the connector 130e, 130f, 130a. For the purpose of getting an equal distance, between two centers of any two adjacent device portions, in the extended state, the length of the connector 130a is longer than that of the connector 130f, which is longer the connector 130e. Therefore, even at least one of connectors 130a-130f may have a different length from another one, but the network structure 100 in the extended state may be configured to have a regular structure. In one example, each distance between two centers of any two adjacent device portions may be kept as a constant although one of the connectors 130a-130f has a different length from another one.

Figure 4A:
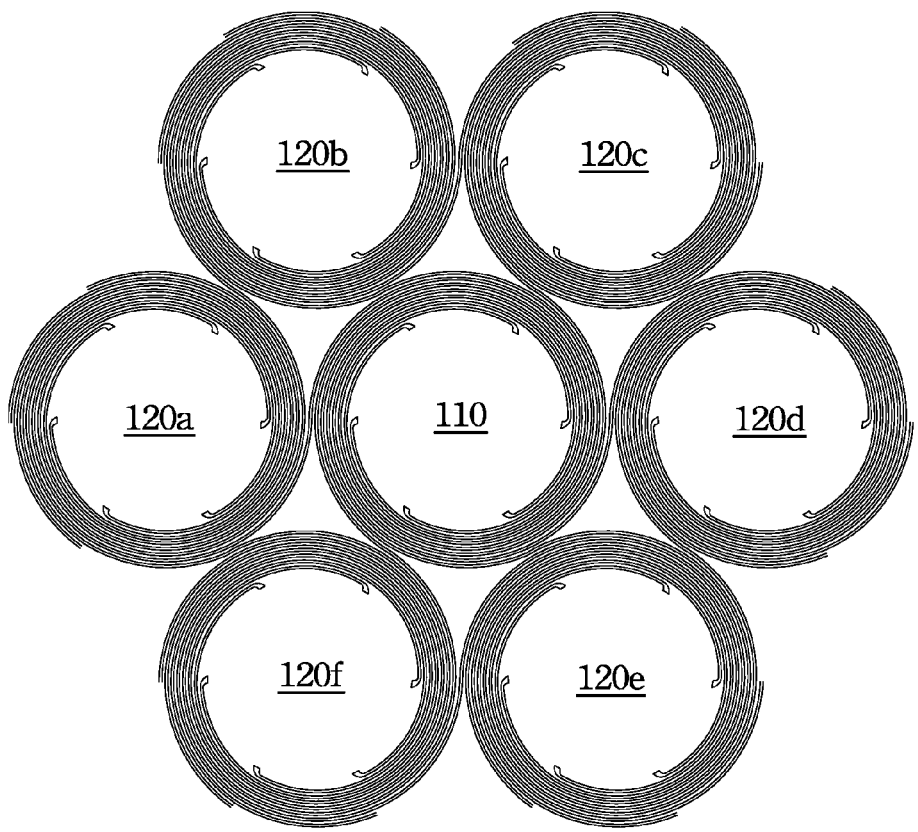
FIG. 4A is a top view schematically illustrating an extendable network structure in an initial state according to another embodiment of the present disclosure.
Figure 4B:
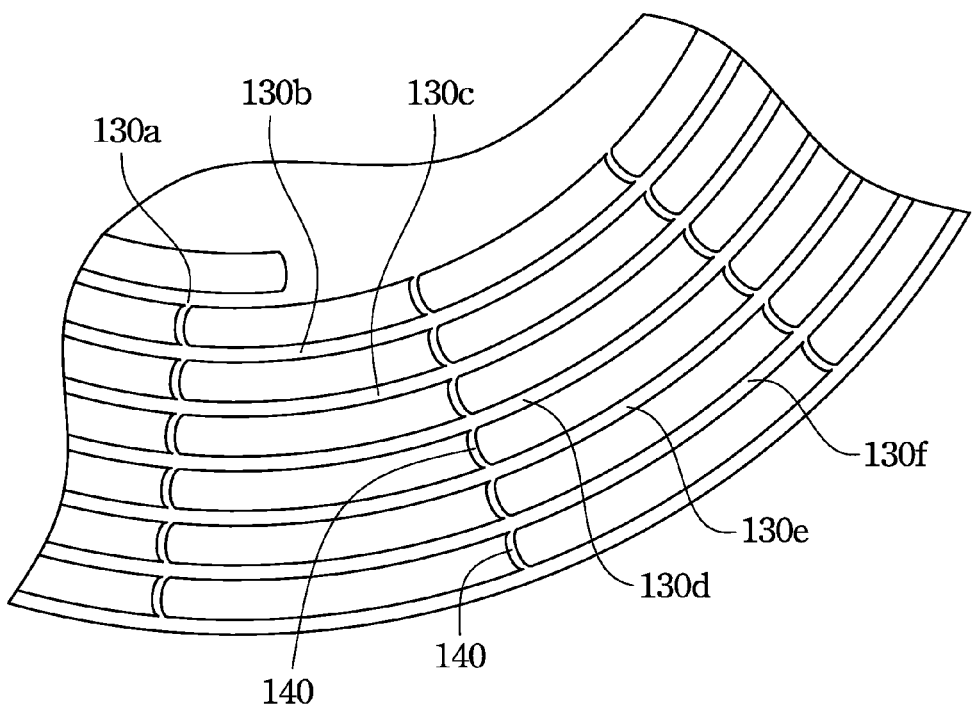
FIG. 4B is an enlarged drawing of the connectors in an initial state according to one embodiment of the present disclosure.

FIG. 4A is a top view schematically illustrating an extendable network structure 100 in an initial state according to another embodiment of the present disclosure. FIG. 4B depicts an enlarged drawing of the connectors 130a-130f. The network structure 100 depicted in FIG. 4A is configured in a way similar to those described above. The central portion 110 is substantially shaped in a circle, in which semiconductor element may be disposed. The six connectors 130a-130f extended from the central portion 110 wind around the central portion 110, and are further connected to the surrounding portion 120a-120f respectively. The number of windings may be adjusted to meet a desired structure of the extended state. In one example, the extendable network structure 100 may further comprise a plurality of bridges 140 for tying the connectors 130a-130f together in the initial state. Each of the bridges interconnects between two of the connectors. The bridges 140 may be broken while the connectors are stretched due to the extension of the network structure 100. The bridges 140 may have a lower mechanical strength than the connectors, so that the bridges 140 are easier to be broken. In one example, each of the bridges 140 has a width that is less than each of the connectors 130a-130f. In another example, each of the bridges 140 is configured to have a curved contour that presents a small radius of curvature or a sharp corner as stress-concentration sites. The bridges 140 may be configured to interconnect between the central portion 110 and one of the connectors 130a-130f as well. Any embodiment described in the present disclosure may comprise the bridges 140 described herein.

Figure 4C:
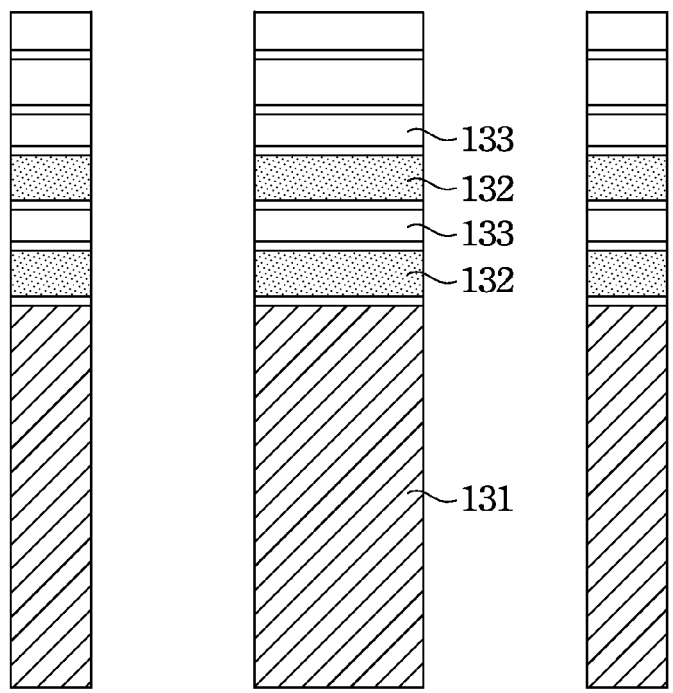
FIGS. 4C-4D are cross-sectional views schematically illustrating a connector according to embodiments of the present disclosure.
Figures 4D, 4E:
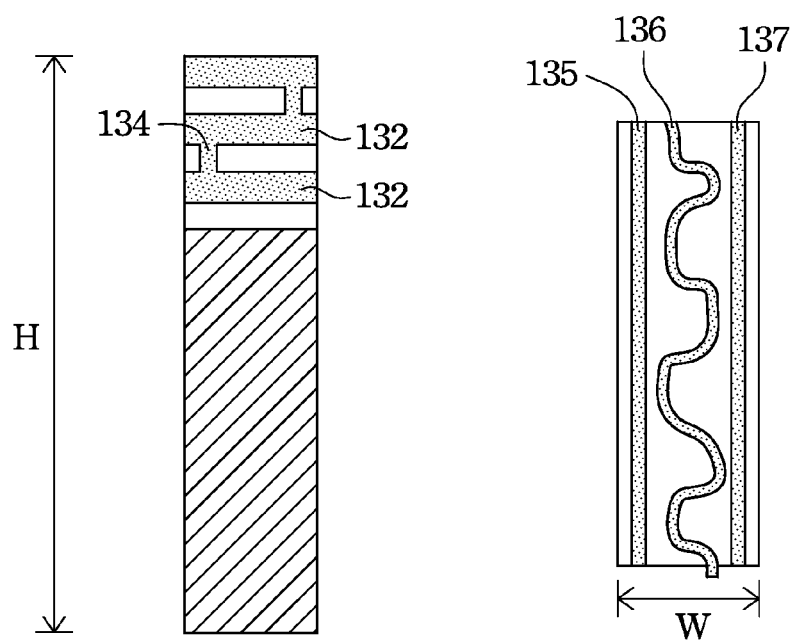
FIG. 4E is a top view schematically illustrating a connector according to one embodiment of the present disclosure.

FIG. 4C is a cross-sectional view schematically illustrating one of the connector 130a-130f according to one embodiment of the present disclosure. The connector comprises a substrate 131, a plurality of dielectric layers 133, and a plurality of metal layers 132. The substrate 131 may be part of a silicon wafer, for example. The dielectric layers 133 may comprise silicon oxide, silicon nitride or the like. The metal layers 132 may comprise copper, aluminum, silver or gold. In one example, there exists a dielectric layers 133 disposed between two adjacent metal layers 132. In another example, one metal layer may be electrically connected to another metal layer through the connecting via 134, as depicted in FIG. 4D. In some examples, a plurality of conductive wires 135, 136, 137 may be formed in a connector, as depicted in FIG. 4E that illustrates a top view of a connector. Each of the conductive wires 135, 136, 137 may has a different shape, size or material. In other examples, the height H of each of the connectors 130, depicted in FIG. 4D, may be different from the central portion. In examples, the width W of the connector, depicted in FIG. 4E, may be about 10 nm to about 50 μm, and the height of the connector may be about 1 μm to about 500 μm.

In one embodiment, the connector has a parameter Z and a breaking strain. The parameter Z is defined by the following formula:

$$Z = \frac{\left(-\frac{W}{2}\right)\left(\frac{1}{R_f} - \frac{1}{R_i}\right)}{1 - \frac{W}{2R_i}},$$

in which W represents a width of a portion of the connector, $R_f$ represents a radius of curvature of the portion of the connector in the extended state, and $R_i$ represents a radius of curvature of the portion of the connector in the initial state. The parameter Z of the connector is less than the breaking strain of the connector.

Figure 4F:
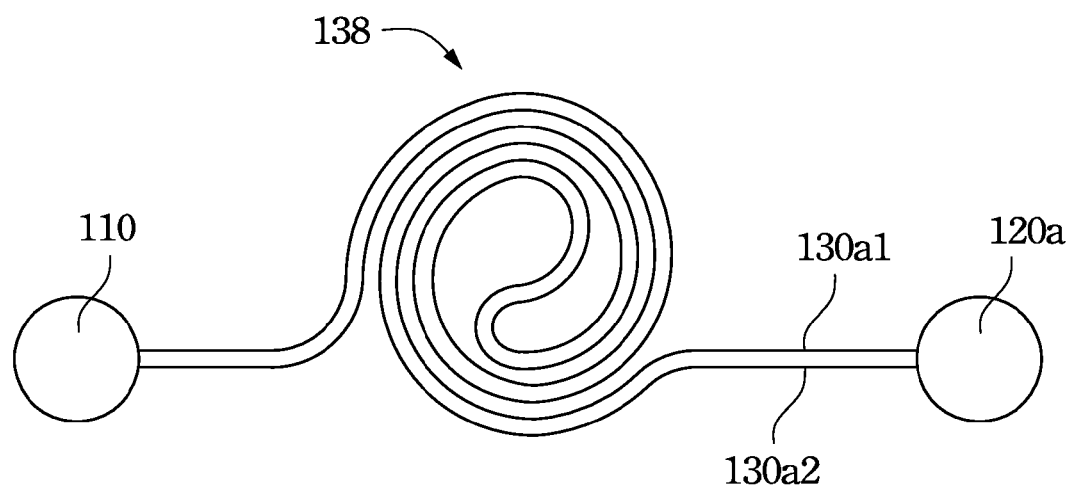
FIG. 4F is a top view schematically illustrating another arrangement of a connector according to one embodiment of the present disclosure.

The connector may have a different morphology than those described above. In one embodiment, the connector may be coiled at a position between any of two device portions, as depicted in FIG. 4F. Particularly, the connector 130a may have a coiled portion 138 which winds around itself multiple times, but without going around any device portion. It is noted that each of the connector may be composed of one or more sub-connectors. In one example, the connector 130a is composed of two sub-connectors 130a1, 130a2. Both the sub-connectors 130a1, 130a2 are substantially in parallel. It is not necessary that the connector have to be coiled up in complete circles. For example, the connector may twist between two device portions.

Figure 4G:
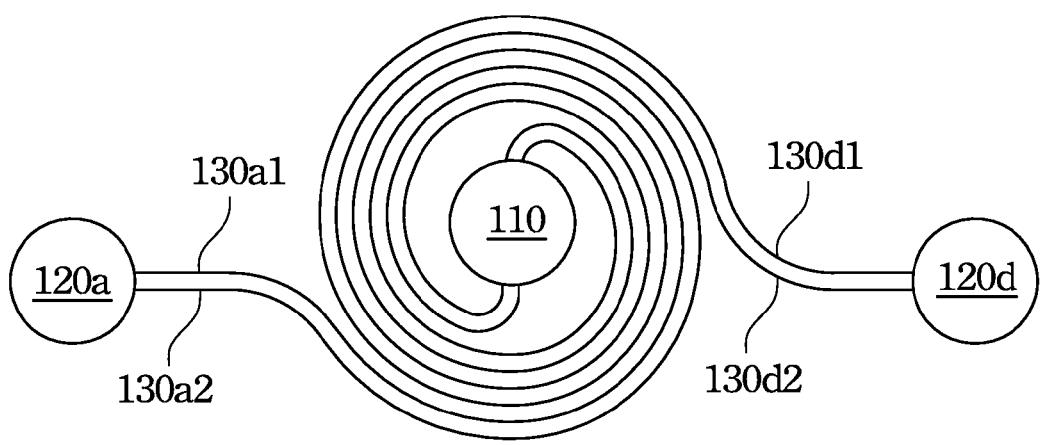
FIG. 4G is a top view schematically illustrating still another arrangement of a connector according to one embodiment of the present disclosure.

In another embodiment, the connectors may wind around some device portions whereas other device portions are not wound by any connector, as depicted in FIG. 4G. Particularly, the connector 130a, 130d substantially wind around the central portion 110, but does not go around the surrounding portions 120a, 120d. In this embodiment, each of the connectors 130a, 130d may be composed of one or more sub-connectors in the embodiment. In examples, the connectors 130a, 130d may respectively comprise sub-connectors 130a1, 130a2 and sub-connectors 130d1, 130d2. In other examples, about one-third of the length of a connector may wind around one device portion, whereas the other two-thirds of the length of the connector may wind around another adjacent device portion (not shown in FIG. 4G). The connector may have a totally different morphology than those described above. FIG. 5A is a top view schematically illustrating a connector 130 in an initial state according to one embodiment of the present disclosure. FIG. 5B depicts a top view illustrating the connector 130 in an extended state. The connector 130 comprises a plurality of arms 140 and a plurality of 90 degree-rotation-restriction joints 150. Any two adjacent arms 140 are joined by one of the 90 degree-rotation-restriction joints 150, and thus allowing the connector 130 to be extendable. Each of the 90 degree-rotation-restriction joints 150 comprises a body 152 and a first hook 156. The body 152 of the joints 150 has a first cavity 154 for joining to the arm 140. Furthermore, first hook 156 extends from the body 152 and may be operable to join to another arm. Each of the arms 140 comprises an end 147 having a second hook 148 that extends into the first cavity 154. The arm 140 further comprises an opposite end 144 having a second cavity 146 for housing a first hook 156 of another 90 degree-rotation-restriction joints.

When the connector 130 are extended or unraveled by providing pulling force, the connector 130 may be extended from a folded state depicted in FIG. 5A to a straight state depicted in FIG. 5B. In particular, the first and second hooks 156, 148 may be rotated within the second and first cavities 146, 154 respectively. Therefore, each of the arms 140 and joints 150 may be rotated relative to each other, and thus providing the connector 130 an extendable function.

In one example, the connector 130 may further comprise a plurality of metal wires 160, and each of the metal wires 160 is connected with an arm 140 and an adjacent 90 degree-rotation-restriction joint 150. The connector 130 may provide the function of electrical connection between two device portions by these metal wires 160. Particularly, it is noted that each of the arms 140 and the 90 degree-rotation-restriction joints 150 may comprise a conductive material or layer. Referring to FIG. 5A, point A may be electrically connected to point B through a metal wire 160, and then point B is electrically connected to point C through the conductive material formed in the arm 140. Furthermore, point C is electrically connected to point D through another metal wire. In this way, two device portions may be electrically connected through the connector 130 even though the connector 130 includes several rotating structure.

Figure 6:
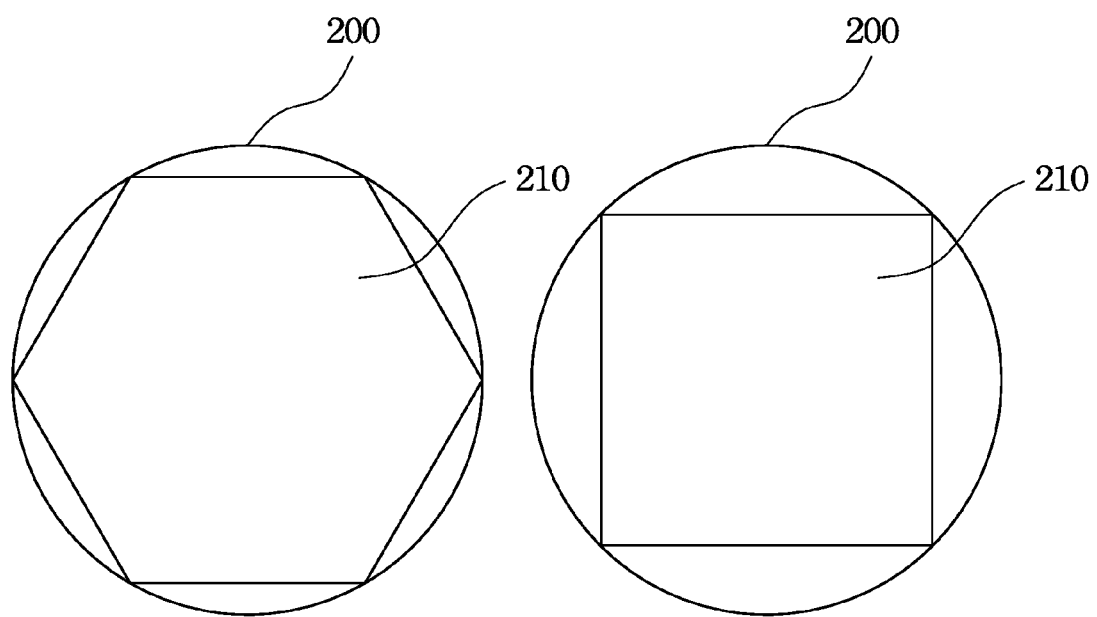
FIG. 6 is a top view schematically illustrating a layout of an extendable network structure formed on a substrate according to one embodiment of the present disclosure.

FIG. 6 is a top view schematically illustrating a layout of an extendable network structure 210 formed on a substrate 200 according to one embodiment of the present disclosure. The substrate 200 may be a silicon wafer, for example, on which the extendable network structure 210 in the initial state is formed. The region of network structure 210 may have a hexagonal shape or a square shape, as depicted in FIG. 6, or some other shapes.

Several processes used in microelectromechanical systems (MENS) may be employed to form the network structure 210 on the substrate 200. For instance, a deep-reactive-ion etching (DRIE) may be used to define the device portions and the connectors, and followed by a process to remove the network structure from the substrate. In another example, the substrate 200 may be a silicon-on-insulator (SOI) wafer so that the network structure 210 may be fabricated thereon.

Figure 7:
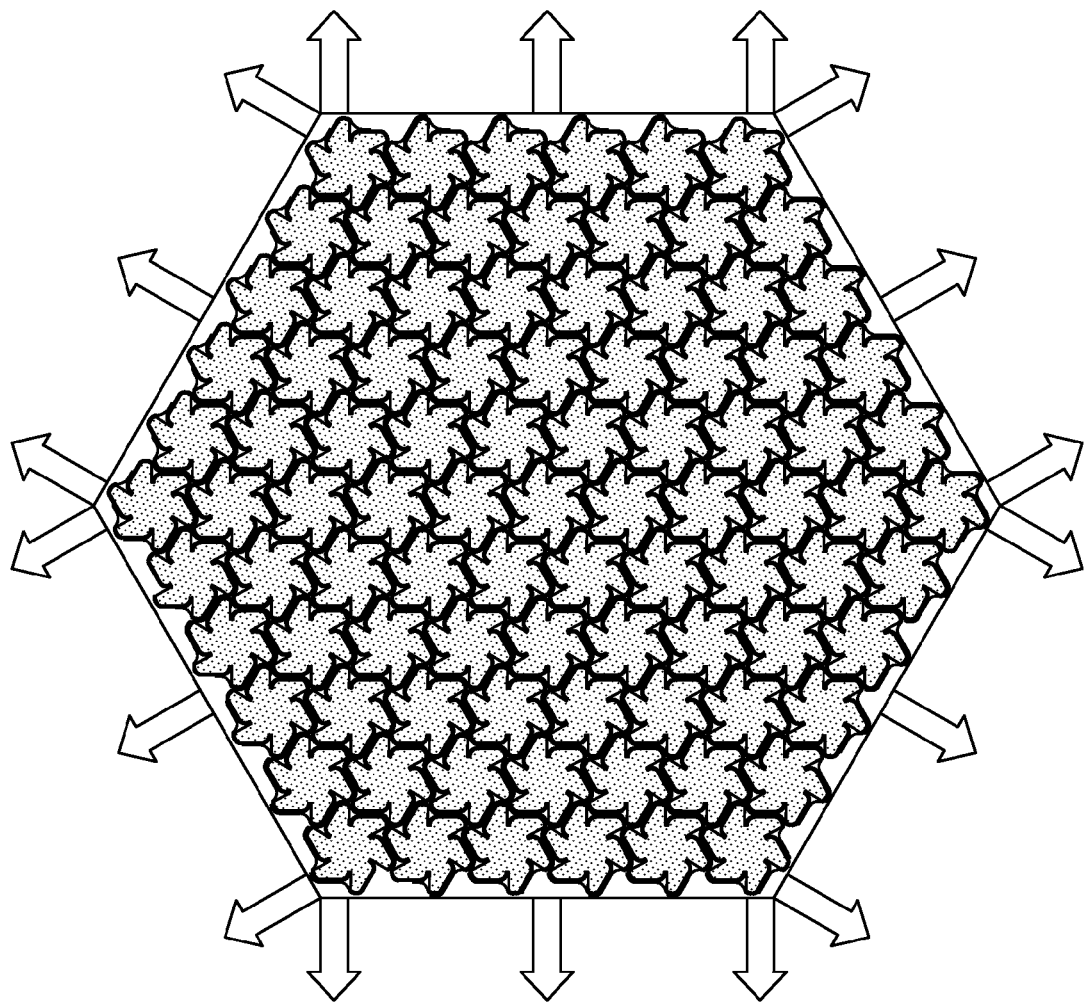
FIG. 7 is a top view schematically illustrating pulling force provided on a periphery of an extendable network structure according to one embodiment of the present disclosure.

The area out of the region of the extendable network structure 210 may be removed, as shown in FIG. 7. Pulling force may be provided on a portion of or all the periphery of the network structure 210, so as to extend or unravel the connectors formed in the network structure 210. Therefore, the extendable network structure may be extended from the initial state to the extended state.

FIG. 8A is a top view schematically illustrating an extendable network structure in the extended state according to one example of the present disclosure. In this example, one central portion 110 is connected with six surrounding portions 120 through connector 130. In this extended state, an included angle formed between two adjacent connectors 130 is about 60 degrees.

Although hereinbefore the number of the surrounding portions is illustrated by six, however, the number of the surrounding portions is not limited on the number of six. FIG. 8B is a top view schematically illustrating an extendable network structure, in which a central portion is surrounded by three surrounding portions, according to one embodiment of the present disclosure. In this embodiment, the extendable network structure comprises a central portion 110, three surrounding portions 120 and three connectors 130. Each of the central portion 110 and the surrounding portions 120 comprises a semiconductor device. Further, each of the surrounding portions 120 is connected to the central portion 110 through one of the connectors 130. The central portion 110 has a first center while each of the surrounding portions 120 has a second center. The connectors 130 may be extendable from an initial state to an extended state, such that the distance between the first center and one of the second centers in the extended state is at least 1.1 fold of the distance between the first center and the second center in the initial state. In one example, at least one of the connector 130 has a length that is different from another one. In other examples, an angle formed between two adjacent connectors 130, in the extended state, is about 120 degrees. In some examples, one or more device portions 120 may be replaced by node(s) which does not comprise any semiconductor element. Therefore, it is possible that one central portion 110 is connected with one or two surrounding portions 120 only.

In another embodiment, one central portion may be connected with four surrounding portions, as depicted in FIG. 8C. In this embodiment, an angle formed between two adjacent connectors in the extended state is about 90 degrees.

It is noted that the embodiments depicted in FIG. 8A to FIG. 8C may be simultaneously implemented in an extendable network structure. For instance, the extendable network structure may include a first region and a second region. In the first region, each of the central portions may be connected with six connectors. In the second region, each of the central portions may be connected with four or three connectors. Therefore, each of the device portions in one region may possess a different amount of connectors from that in another region.

In one embodiment, at least one of the device portions (i.e. the central portion or surrounding portions) includes a radio frequency identification circuit, and at least one of the connectors comprises an antenna made of metal material. Each of the device portions may independently provide an individual function. Alternatively, a group of the device portions cooperate together to provide an individual function.

Figure 9:
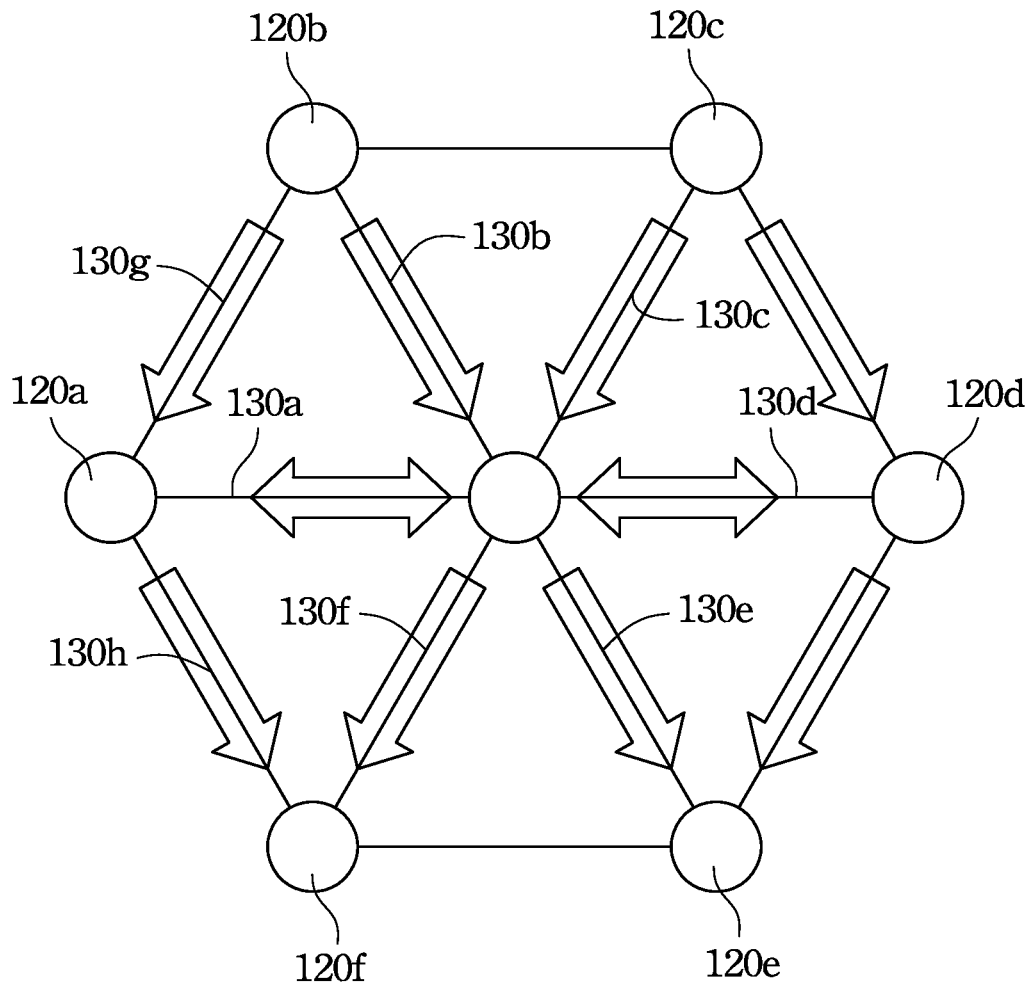
FIG. 9 illustrates an electrical connection between device portions according to one embodiment of the present disclosure.

FIG. 9 illustrates an electrical connection between device portions according to one embodiment of the present disclosure. In this embodiment, each device portion is connected with six connectors, for example connectors 130a-130f. Particularly, the device portion 110 is provided with two connectors 130b and 130c for receiving electric signals, and is also provided with another two connectors 130e and 130f for outputting electric signals. The device portion 120b may be electrically connected to device portion 120f either through the connectors 130b, 130f or through the connector 130g, 130h. Therefore, the network structure is possible to be automatically reconfigured when one connector breaks. Furthermore, the other two connectors 130a and 130d may be used to transmit other signals in certain applications. Alternatively, the connectors 130a, 130d may be used to form an electrical connection in parallel.

Figure 10A:
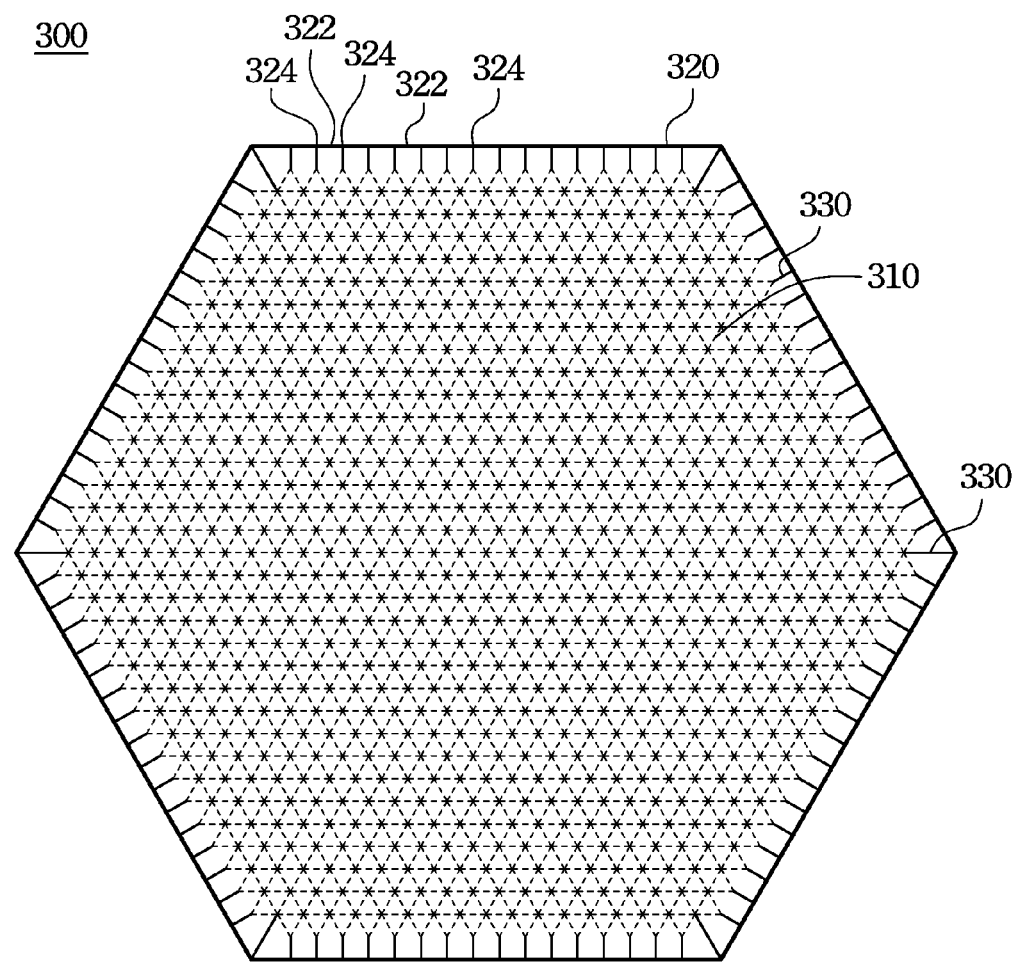
FIG. 10A is a top view schematically illustrating an extendable network structure in an initial state according to one embodiment of the present disclosure.
Figure 10B:
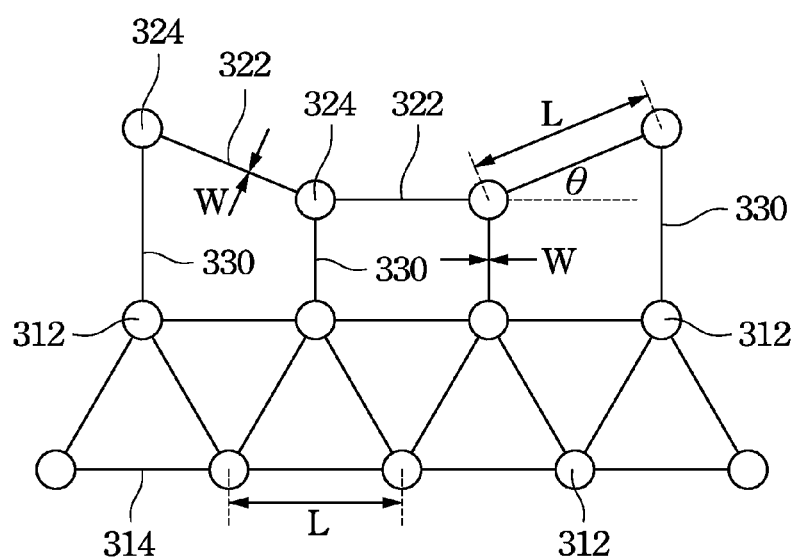
FIG. 10B is a top view schematically illustrating an extended state of the extendable network structure depicted in FIG. 10A.

FIG. 10A is a top view schematically illustrating an extendable network structure 300 in an initial state according to one embodiment of the present disclosure. FIG. 10B schematically illustrates an extended state of the extendable network structure 300.

Referring to FIG. 10A and FIG. 10B, the extendable network structure 300 includes a device network 310 arranged therein. The device network 310 includes a plurality of device portions 312 and a plurality of first connectors 314. Any two adjacent device portions are electrically connected by one of the first connectors 314, and thereby forming the device network 310.

The extendable network structure 300 further includes a supporting beam 320 that surrounds the device network 310. The supporting beam 320 comprises a plurality of second connectors 322 and a plurality of nodes 324. Any two adjacent nodes 324 are physically connected by a second connector 322. The supporting beam 320 forms a closed-loop surrounding the device network 310. In one example, at least one of the second connectors 322 has a length L that is different from another second connector 322. Specifically, an angle θ, which is between 0 degree and 90 degrees, is formed between two adjacent second connector 322 when the extendable network structure 300 is in the extended state. Accordingly, the two adjacent second connectors 322 may be design to have different lengths from each other. In another example, each of the second connectors 322 is composed of two or more sub-connectors arranged in parallel for the purpose of increasing the mechanical strength of the supporting beam 320. In still another example, the width W of each of the second connectors 322 may be different from each of the first connectors 314.

Furthermore, extendable network structure 300 includes a plurality of third connectors 330 disposed between the supporting beam 320 and the device network 310. Each of the third connectors 330 is connected with a node 324 of the supporting beam 320 and a device portion 312 that is located at a periphery of the device network 310.

In this embodiment, each of the peripheral device portions 312, which are positioned at the outmost edge of the device network 310, is connected with totally five connectors (i.e. one connector 330 and four connectors 314). The other device portions, which are positioned in the inner of the device network 310, are respectively connected with six connectors 314. That is to say, each of the peripheral device portions may possess a different amount of connectors from the other device portions, placed in the inner of the device network 310. In another example, the peripheral device portion 312 may have a different shape from the rest of the device portion positioned in the inner of the device network 310. The first, second and third connectors 314, 322, 330 may be any example connector described hereinbefore. Each of the first, second and third connectors 314, 322, 330 is extendable from an initial state to an extended state, such that a spacing interval existed between two adjacent device portions 312 in the extended state is at least 1.1 fold of a spacing interval existed between the two device portions in the initial state. While the extendable network structure 300 is in the extended state, the third connectors 330 provide a tension to the periphery of the device network 310 so as to allow the device portions 312 in the device network 310 to be located at desired positions. For this purpose, at least one of the third connectors 330 may have a length that is different from another third connector 330. For instance, two adjacent third connectors 330 may be configured to have different lengths from each other, as depicted in FIG. 10B. In another example, the width of each of the third connectors 330 is different from each of the first connectors 314.

Figure 10C:
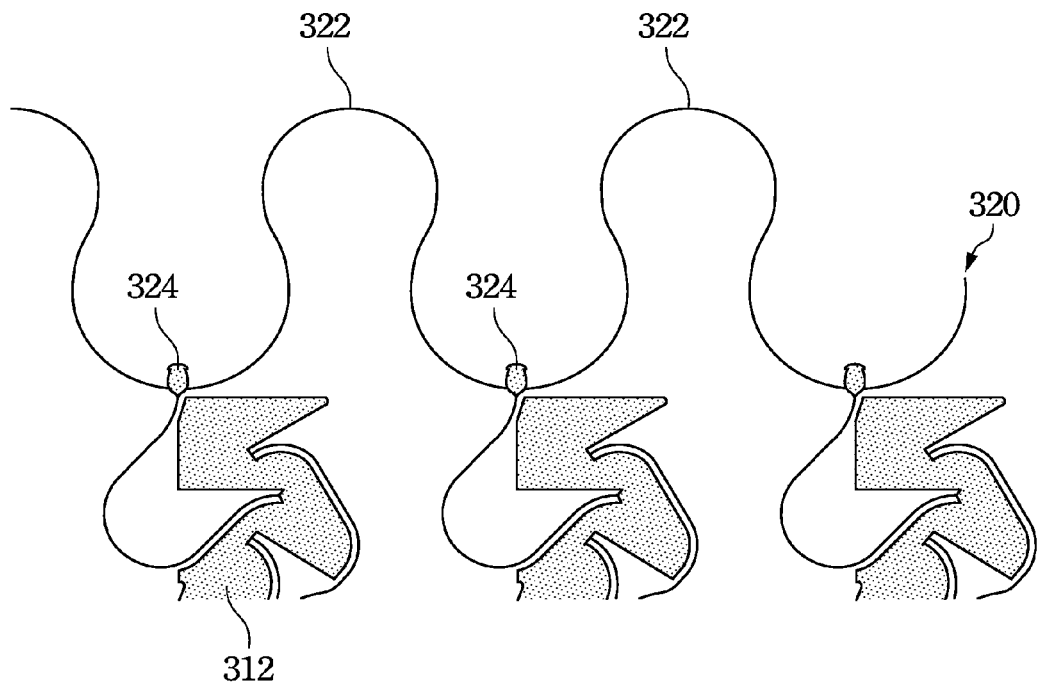
FIG. 10C is a top view schematically illustrating a supporting beam in an initial state according to one embodiment of the present disclosure.
Figure 10D:
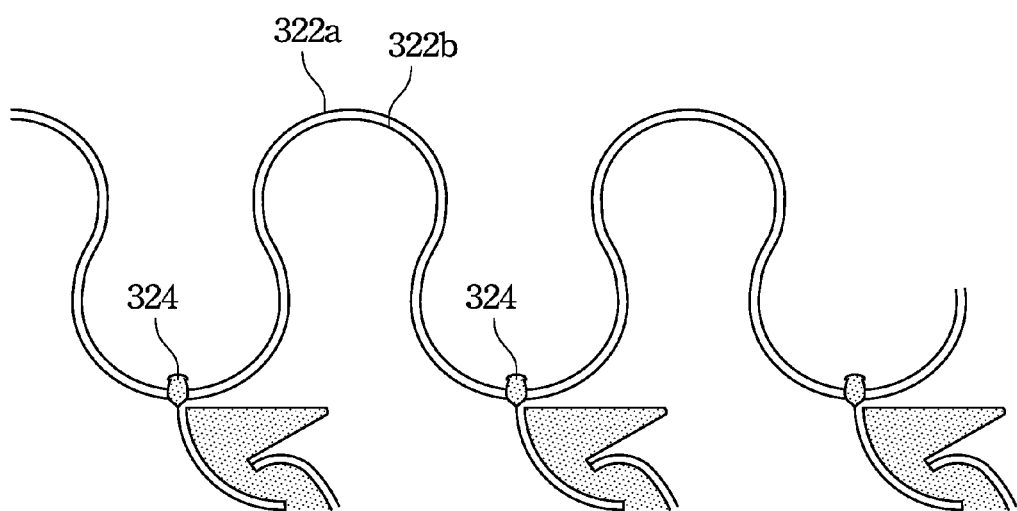
FIG. 10D is a top view schematically illustrating a supporting beam in an initial state according to another embodiment of the present disclosure.

FIG. 10C is a top view schematically illustrating a supporting beam in an initial state according to one embodiment of the present disclosure. Similarly, the supporting beam 320 may comprise a plurality of second connectors 322 and a plurality of nodes 324. Each of the second connectors 322 twists between two adjacent nodes 324, so that the length of the second connector 322 is longer than the distance between two adjacent nodes 324. Each of the second connectors 322 may comprise two or more sub-connectors, as depicted in FIG. 10D. Particularly, each of the second connectors 322 is composed of two sub-connectors 322a, 322b.

Figure 11:
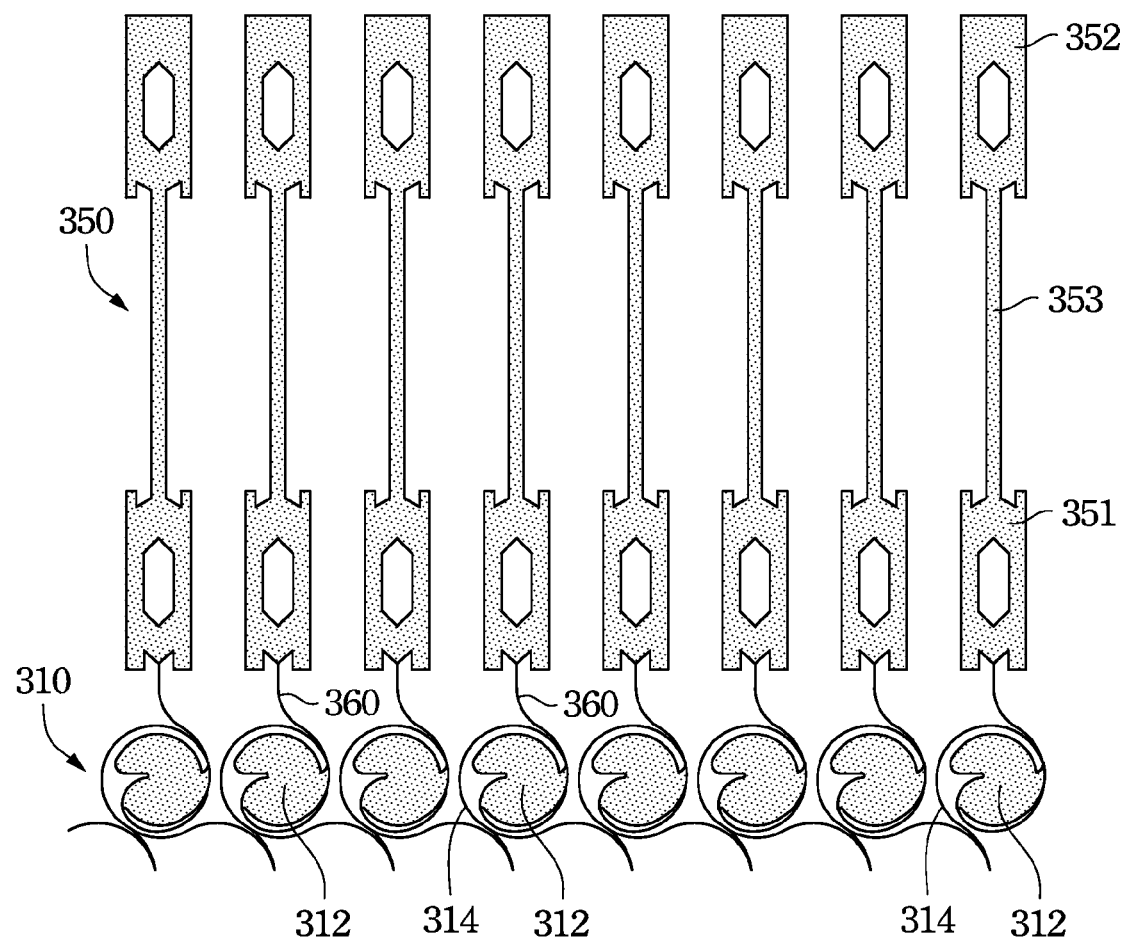
FIG. 11 is a top view schematically illustrating an extendable network structure in an initial state according to another embodiment of the present disclosure.

FIG. 11 is a top view schematically illustrating an extendable network structure 300 in an initial state according to another embodiment of the present disclosure. The extendable network structure 300 comprises a device network 310, a plurality of pulling pads 350 and a plurality of pulling wires 360. The device network 310 may have a structure similar to those described above in connection with FIG. 10A-10D. The pulling pads 350 are disposed at a periphery of the device network 310, and are configured to deploy the device network 310. Each of the pulling wires 360 interconnects between one of the pulling pads 350 and the device network 310.

In one embodiment, each of the pulling pads 350 is connected to only one peripheral device portion 312 through a pulling wire 360 only. The pulling wire 360 may have a structure that is the same as or different from the first connectors 314. In one example, the mechanical strength of the pulling wire 360 is different from that of the first connectors 314.

In another embodiment, the amount of the pulling pads 350 is less than the amount of the peripheral device portion 312. In this case, a portion of the peripheral device portions 312 is not connected to the pulling pad 350 through the pulling wire 360.

In still another embodiment, each of the pulling pads 350 has a maximum dimension different from that of each of the device portions 312. Specifically, each of the pulling pads 350 includes a first portion 351, a second portion 352 and a neck portion 353 interconnected therebetween. The neck portion 353 may be straight in shape as depicted in FIG. 11. However, in some examples, the neck portion 353 may be coiled up or twisted like the connectors described hereinbefore. Both the first and the second portion 351, 352 are capable of being attached to an article or machine for deploying the extendable network structure 300. It is noted that each of the pulling pads 350 may have a shape that is substantially the same as the device portion 312 although the pulling pads 350 depicted in FIG. 11 is different from the device portion in shape.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. An extendable network structure, comprising:
a first and a second device portion respectively having a first and a second center, each of the first and second device portions comprising a semiconductor element; and
at least three connectors connected to the first device portion, wherein the second device portion is electrically connected to the first device portion through one of the three connectors;
wherein each of the connectors is extendable from an initial state to an extended state, such that a first distance between the first and second centers in the extended state is at least 1.1 fold of a second distance between the first and second centers in the initial state, and wherein each of the connectors has a parameter Z and a breaking strain, and the parameter Z of said each of the connectors is less than the breaking strain thereof,
wherein the parameter Z is defined by the following formula:

$$Z = \frac{\left(-\frac{W}{2}\right)\left(\frac{1}{R_f} - \frac{1}{R_i}\right)}{1 - \frac{W}{2R_i}},$$

wherein W represents a width of a portion of any one of the connectors, $R_f$ represents a radius of curvature of the portion of said any one of the connectors in the extended state, and $R_i$ represents a radius of curvature of the portion of said any one of the connectors in the initial state.

2. The extendable network structure of claim 1, wherein the first and second centers are geometric centers, mass centers or centers of symmetry.

3. The extendable network structure of claim 1, wherein each of the device portions and each of the connectors are part of a common material layer formed on a substrate.

4. The extendable network structure of claim 1, wherein the three connectors are substantially arranged on an identical level.

5. The extendable network structure of claim 1, wherein the first and second device portions are of identical shapes.

6. The extendable network structure of claim 1, wherein at least one of the first and second device portions comprises a radio frequency identification circuit, and at least one of the three connectors comprises an antenna.

7. The extendable network structure of claim 4, wherein an included angle formed between two adjacent connectors, in the extended state, is about 120 degrees.

8. An extendable network structure, comprising:
a central portion having a first center;
at least three surrounding portions arranged around the central portion, and each of the surrounding portions having a second center, wherein each of the central portion and the surrounding portions comprises a semiconductor device; and
at least three connectors, wherein each of the surrounding portions is connected to the central portion through one of the connectors;
wherein each of the connectors is extendable from an initial state to an extended state, such that a first distance between the first center and one of the second centers in the extended state is at least 1.1 fold of a second distance between the first center and the second center in the initial state, and wherein each of the connectors has a parameter Z and a breaking strain, and the parameter Z of said each of the connectors is less than the breaking strain thereof,
wherein the parameter Z is defined by the following formula:

$$Z = \frac{\left(-\frac{W}{2}\right)\left(\frac{1}{R_f} - \frac{1}{R_i}\right)}{1 - \frac{W}{2R_i}},$$

wherein W represents a width of a portion of any one of the connectors, $R_f$ represents a radius of curvature of the portion of said any one of the connectors in the extended state, and $R_i$ represents a radius of curvature of the portion of said any one of the connectors in the initial state.

9. The extendable network structure of claim 8, further comprising:
a fourth surrounding portion; and
a fourth connector connecting the fourth surrounding portion to the central portion.

10. The extendable network structure of claim 8, wherein each of the connectors wind around the central portion while each of the connectors is in the initial state.

11. The extendable network structure of claim 8, further comprising a plurality of bridges, wherein each of the bridges interconnects between two of the connectors.

12. The extendable network structure of claim 8, wherein each of the surrounding portions has a shape that is the same as the central portion.

13. The extendable network structure of claim 8, wherein each of the connectors has a height that is different from the central portion.

14. The extendable network structure of claim 8, wherein at least one of the three connectors has a length that is different from another connector.

15. The extendable network structure of claim 8, wherein all the three connectors are equi-length.

16. The extendable network structure of claim 9, wherein all the connectors are substantially arranged on an identical level, and an included angle formed between two adjacent connectors in the extended state is about 90 degrees.

17. The extendable network structure of claim 10, further comprising a plurality of bridges, wherein each of the bridges interconnects between the central portion and one of the connectors.

18. The extendable network structure of claim 12, each of the central portion and the surrounding portions has a circular shape.

19. The extendable network structure of claim 12, wherein each of the central portion and the surrounding portions comprises:
a body; and
a plurality of petal portions extended from the body.

20. The extendable network structure of claim 19, wherein at least one of the petal portions comprises a straight edge and a curved edge.

21. An extendable network structure, comprising:
a central portion having a first center;
at least three surrounding portions arranged around the central portion, and each of the surrounding portions having a second center, wherein each of the central portion and the surrounding portions comprises a semiconductor device; and at least three connectors, wherein each of the surrounding portions is connected to the central portion through one of the connectors;

wherein each of the connectors is extendable from an initial state to an extended state, such that a first distance between the first center and one of the second centers in the extended state is at least 1.1 fold of a second distance between the first center and the second center in the initial state, and wherein each of the connectors comprises a plurality of arms and a plurality of 90 degree-rotation-restriction joints, and wherein any two adjacent arms are joined by one of the 90 degree-rotation-restriction joints, and thus allowing each of the connectors to be extendable.

22. The extendable network structure of claim 21, further comprising a plurality of metal wires, wherein each of the metal wires is connected with one of the arms and one of the 90 degree-rotation-restriction joints that adjoins the arm.

23. The extendable network structure of claim 22, wherein each of the 90 degree-rotation-restriction joints comprises:
a body having a first cavity for joining to one of the arms; and
a first hook extended from the body and operable to join to another arm.

24. The extendable network structure of claim 23, wherein each of the arms comprises:
an end having a second cavity for housing the first hook; and
an opposite end having a second hook that extends into one of the first cavity.

25. An extendable network structure, comprising:
a central portion;
at least six connectors connected to the central portion, wherein each of the connectors is extendable from an initial state to an extended state; and
at least six surrounding portions spaced apart from the central portion, wherein the surrounding portions are connected to the central portion through each respective connectors, and wherein the central portion and each of the surrounding portions comprises a semiconductor device;
wherein a minimum distance existed between the central portion and the surrounding portions in the extended state is at least 1.1 fold of a minimum distance existed between the central portion and the surrounding portions in the initial state, and wherein each of the connectors has a parameter Z and a breaking strain, and the parameter Z of said each of the connectors is less than the breaking strain thereof,
wherein the parameter Z is defined by the following formula:

$$Z = \frac{\left(-\frac{W}{2}\right)\left(\frac{1}{R_f} - \frac{1}{R_i}\right)}{1 - \frac{W}{2R_i}},$$

wherein W represents a width of a portion of any one of the connectors, $R_f$ represents a radius of curvature of the portion of said any one of the connectors in the extended state, and $R_i$ represents a radius of curvature of the portion of said any one of the connectors in the initial state.

26. The extendable network structure of claim 25, wherein the six surrounding portions are substantially arranged on an identical level, and an included angle formed between two adjacent connectors, in the extended state, is about 60 degrees.

27. The extendable network structure of claim 25, wherein each of the connectors comprises a metal layer.

28. The extendable network structure of claim 25, wherein each of the surrounding portions has a shape that is the same as the central portion.

29. The extendable network structure of claim 25, wherein at least one of the connectors has a length that is different from another connector.

30. The extendable network structure of claim 25, wherein all the six connectors are equi-length.

31. The extendable network structure of claim 28, wherein each of the surrounding and central portions comprises:
a body; and
six petal portions extended from the body.

32. The extendable network structure of claim 31, wherein at least one of the petal portions comprises a straight edge and a curved edge.

33. The extendable network structure of claim 31, wherein each of the petal portions comprises a curved edge.

34. An extendable network structure, comprising:
a device network comprising a plurality of device portions and a plurality of first connectors, each of the device portions having a semiconductor element, and any two adjacent device portions being connected by one of the first connectors to form the device network, and wherein each of the first connectors has a parameter Z and a breaking strain, and the parameter Z of said each of the first connectors is less than the breaking strain thereof,
wherein the parameter Z is defined by the following formula:

$$Z = \frac{\left(-\frac{W}{2}\right)\left(\frac{1}{R_f} - \frac{1}{R_i}\right)}{1 - \frac{W}{2R_i}},$$

wherein W represents a width of a portion of any one of the first connectors, $R_f$ represents a radius of curvature of the portion of said any one of the first connectors in the extended state, and $R_i$ represents a radius of curvature of the portion of said any one of the first connectors in the initial state;
a supporting beam comprising a plurality of second connectors and a plurality of nodes, wherein any two adjacent nodes are connected by one of the second connectors, and thus forming a closed-loop surrounding the device network, wherein at least one of the second connectors has a length that is different from another second connector; and
a plurality of third connectors, each of the third connectors being connected with one of the nodes and one of the device portions that is located at a periphery of the device network;
wherein each of the first, second and third connectors is extendable from an initial state to an extended state, such that a spacing interval existed between two adjacent device portions in the extended state is at least 1.1 fold of a spacing interval existed between the two device portions in the initial state.

35. The extendable network structure of claim 34, wherein each of the third connectors provides a tension to the periphery of the device network while each of the first, second and third connectors is in the extended state.

36. The extendable network structure of claim 34, wherein each of the second connectors has a width that is different from each of the first connectors.

37. The extendable network structure of claim 34, wherein at least one of the third connectors has a length that is different from another third connector.

38. The extendable network structure of claim 34, wherein each of the third connectors has a width that is different from each of the first connectors.

39. The extendable network structure of claim 34, wherein each of the peripheral device portions is connected to the first and third connectors in a first amount, and each of the device portions, that are not located at the periphery of the device network, is connected to the first connectors in a second amount, wherein the first amount is different from the second amount.

40. The extendable network structure of claim 34, wherein each of the device portions provides an individual function.

41. The extendable network structure of claim 34, wherein a group of the device portions cooperate together to provide an individual function.

42. An extendable network structure, comprising:
a device network comprising:
a plurality of connectors capable of being deployed; and
a plurality of device portions, each of the device portions having a semiconductor element, and any two adjacent device portions being connected by one of the connectors to form the device network, wherein the device network is extendable from an initial state to an extended state by deploying each of the connectors, such that a minimum distance between two adjacent device portions in the extended state is at least 1.1 fold of a minimum distance between the two device portions in the initial state, and wherein each of the connectors has a parameter Z and a breaking strain, and the parameter Z of said each of the connectors is less than the breaking strain thereof,
wherein the parameter Z is defined by the following formula:

$$Z = \frac{\left(-\frac{W}{2}\right)\left(\frac{1}{R_f} - \frac{1}{R_i}\right)}{1 - \frac{W}{2R_i}},$$

wherein W represents a width of a portion of any one of the connectors, $R_f$ represents a radius of curvature of the portion of said any one of the connectors in the extended state, and $R_i$ represents a radius of curvature of the portion of said any one of the connectors in the initial state;
a plurality of pulling pads configured to deploy the device network, wherein the plurality of pulling pads are disposed at a periphery of the device network, and each of the pulling pads includes a first portion, a second portion and a neck portion interconnected therebetween; and
a plurality of pulling wires, each of the pulling wires interconnected between the first portion of one of the pulling pads and the device network.

43. The extendable network structure of claim 42, wherein each of the pulling pads is connected to one device portion only.

44. The extendable network structure of claim 42, wherein each of pulling pads has a maximum dimension different from that of each of the device portions.

45. The extendable network structure of claim 42, wherein each of the pulling pads has a shape that is substantially the same as the device portion of the device network.

* * * * *